United States Patent
Wristers et al.

(10) Patent No.: US 6,833,307 B1
(45) Date of Patent: Dec. 21, 2004

(54) METHOD FOR MANUFACTURING A SEMICONDUCTOR COMPONENT HAVING AN EARLY HALO IMPLANT

(75) Inventors: Derick Wristers, Bee Cave, TX (US); Chad Weintraub, Dresden (DE); James F. Buller, Austin, TX (US); Jon Cheek, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 79 days.

(21) Appl. No.: 10/284,675

(22) Filed: Oct. 30, 2002

(51) Int. Cl.[7] .............................................. H01L 21/336
(52) U.S. Cl. ........................ 438/302; 438/303; 438/305; 438/306; 438/301
(58) Field of Search ................................ 257/408, 344, 257/404; 438/301, 302, 303, 304, 305, 306, 307, 531, 199

(56) References Cited

U.S. PATENT DOCUMENTS

| | | |
|---|---|---|
| 5,237,193 A | 8/1993 | Williams et al. |
| 5,270,226 A | 12/1993 | Hori et al. |
| 5,432,106 A | 7/1995 | Hong |
| 5,510,280 A | 4/1996 | Noda |
| 5,650,340 A | 7/1997 | Burr et al. |
| 5,670,389 A | 9/1997 | Huang et al. |
| 5,830,788 A * | 11/1998 | Hiroki et al. ................ 438/199 |
| 5,851,886 A | 12/1998 | Peng |
| 5,869,378 A | 2/1999 | Michael |
| 5,891,774 A | 4/1999 | Ueda et al. |
| 5,909,622 A | 6/1999 | Kadosh et al. |
| 5,920,776 A | 7/1999 | Fratin et al. ................ 438/257 |
| 5,925,914 A | 7/1999 | Jiang et al. |
| 5,935,867 A | 8/1999 | Alvis et al. |
| 6,008,094 A | 12/1999 | Krivokapic et al. |
| 6,008,099 A | 12/1999 | Sultan et al. |
| 6,020,611 A | 2/2000 | Ma et al. |
| 6,031,272 A * | 2/2000 | Hiroki et al. ................ 257/404 |

(List continued on next page.)

FOREIGN PATENT DOCUMENTS

| | | | |
|---|---|---|---|
| EP | 0814502 | 12/1997 | .................. 438/302 |

OTHER PUBLICATIONS

High Performance Logic and High–Gain Analog CMOS Transistors Formed by a Shadow–Mask Technique With a Single Implant Step. Hook. Terence B., et al., IEEE Transactions on Electron Devices. vol. 49, No. 9, Sep. 2002.

Asymmetric Source/Drain Extension Transistor Structure for High Performance Sub–50nm Gate Length CMOS Devices, T. Ghani, K. Mistry, P. Packan, M. Armstrong, S. Thompson, S. Tyagi, M. Bohr, Portland Technology Development, TCAD, Intel Corporation, Hillsboro, Symposium on VLSI Technology Digest of Technical Papers, 2001, pp. 17–18.

Impact of Ultrashallow Junction on Hot Carrier Degradation of Sub–0.25–μm NMOSFET's, Kaori Nakamura, Eiichi Murakami, and Shin 'ichiro Kimura, P 27–29, IEEE Electron Device Letters, vol. 21, No. 1, Jan. 2000.

Primary Examiner—Steven Loke
(74) Attorney, Agent, or Firm—Paul Drake; Rennie Wm. Dover

(57) ABSTRACT

An insulated gate field effect semiconductor component having a source-side halo region and a method for manufacturing the semiconductor component. A gate structure is formed on a semiconductor substrate. The source-side halo region is formed in the semiconductor substrate. After formation of the source-side halo region, spacers are formed adjacent opposing sides of the gate structure. A source extension region and a drain extension region are formed in the semiconductor substrate using an angled implant. The source extension region extends under the gate structure, whereas the drain extension may extend under the gate structure or be laterally spaced apart from the gate structure. A source region and a drain region are formed in the semiconductor substrate.

10 Claims, 2 Drawing Sheets

U.S. PATENT DOCUMENTS

| | | | |
|---|---|---|---|
| 6,103,563 A | 8/2000 | Lukanc et al. | |
| 6,140,186 A | 10/2000 | Lin et al. | |
| 6,168,637 B1 | 1/2001 | Randolph et al. | |
| 6,190,980 B1 | 2/2001 | Yu et al. | |
| 6,200,864 B1 | 3/2001 | Selcuk | |
| 6,218,224 B1 | 4/2001 | Lukanc et al. | |
| 6,242,329 B1 * | 6/2001 | Huster et al. | 438/531 |
| 6,255,174 B1 | 7/2001 | Yu | 438/286 |
| 6,268,253 B1 | 7/2001 | Yu | |
| 6,291,325 B1 | 9/2001 | Hsu | |
| 6,344,396 B1 | 2/2002 | Ishida et al. | |
| 6,372,587 B1 | 4/2002 | Cheek et al. | |
| 6,373,103 B1 | 4/2002 | Long et al. | |
| 6,391,728 B1 | 5/2002 | Yu | |
| 6,396,103 B1 | 5/2002 | Riccobene et al. | |
| 6,399,452 B1 | 6/2002 | Krishnan et al. | |
| 6,406,957 B1 | 6/2002 | Wu et al. | |
| 2001/0019869 A1 | 9/2001 | Hsu | |
| 2001/0024847 A1 | 9/2001 | Snyder | |
| 2001/0036713 A1 | 11/2001 | Rodder et al. | 438/514 |

* cited by examiner

METHOD FOR MANUFACTURING A SEMICONDUCTOR COMPONENT HAVING AN EARLY HALO IMPLANT

FIELD OF THE INVENTION

This invention relates, in general, to semiconductor components and, more particularly, to extension-gate edge overlap in a semiconductor component.

BACKGROUND OF THE INVENTION

Integrated circuits such as microprocessors, digital signal processors, microcontrollers, memory devices, and the like typically contain millions of Insulated Gate Field Effect Transistors (IGFETs). Because of the desire to lower manufacturing costs and increase circuit speed, integrated circuit manufacturers shrink the sizes of the IGFET's making up an integrated circuit so that more integrated circuits can be manufactured from a single semiconductor wafer. Although the smaller transistors are capable of operating at increased speeds, secondary performance factors such as decreased source-drain breakdown voltage, increased junction capacitance, and instability of the threshold voltage negatively affect transistor performance. Collectively, these adverse performance effects are referred to as short channel effects.

Typical techniques for mitigating short channel effects rely on adjusting the electric field in the channel region to minimize the peak lateral electric field of the drain depletion region. One technique for lowering the lateral electric field is to include source and drain extension regions. A source extension region extends into a silicon substrate adjacent one side of a gate structure and a drain extension region extends into the silicon substrate adjacent an opposing side of the gate structure. The source and drain extension regions extend under the gate structure. The drain extension region reduces the maximum electric field in the drain region of an insulated gate field effect transistor, thereby reducing the number of electrons capable of tunneling from the drain region into the gate oxide. Even with this improvement, the number of electrons in the drain region is still sufficient to create a gate-to-drain tunneling current that decreases the performance of the transistor.

Accordingly, what is needed is a semiconductor component having a lower gate-to-drain tunneling current and a method for manufacturing the semiconductor component.

SUMMARY OF THE INVENTION

The present invention satisfies the foregoing need by providing a semiconductor component and a method for manufacturing the semiconductor component having a source-side halo region formed before the source and drain extension regions and the source and drain regions are formed. In accordance with one aspect, the present invention comprises a gate structure formed on a semiconductor material of a first conductivity type. After formation of the gate structure, a source-side halo region is formed in the semiconductor material proximal a source side of the gate structure using an ion implantation technique. After formation of the source-side halo region, a first set of spacers is formed on opposing sides of the gate structure followed by implanting a dopant of a second conductivity type using a tilt angle implant to form the source and drain extension regions. A second set of spacers is formed adjacent the first set of spacers and source and drain regions are formed in the semiconductor material.

In accordance with another aspect, the present invention comprises a semiconductor material having a gate structure disposed thereon. A source-side halo region is proximal the source side of the gate structure. A source extension region is proximal the first side of the gate structure and extends under the gate structure and a drain extension region is proximal the second side of the gate structure and may extend under the second side of the gate structure. A source region is proximal and spaced apart from the first side of the gate structure and a drain region is proximal and spaced apart from the second side of the gate structure.

BRIEF DESCRIPTION OF THE DRAWINGS

The present invention will be better understood from a reading of the following detailed description, taken in conjunction with the accompanying drawing figures in which like references designate like elements and in which.

DETAILED DESCRIPTION

Generally, the present invention provides a method for manufacturing a semiconductor component such as an insulated gate semiconductor device. An insulated gate semiconductor device is also referred to as insulated gate field effect transistor, a field effect transistor, a semiconductor component, or a semiconductor device. In accordance with an embodiment of the present invention, asymmetric source/drain extension regions are formed using an angled implant. The use of an asymmetric implant provides overlap between the source extension region and the gate structure thereby reducing the source-side resistance of the transistor. In addition, the asymmetric implant reduces the overlap of the drain extension region by the gate structure, thereby reducing the gate-to-drain tunneling current and the drain-side Miller capacitance. Further, the angled implants allow formation of the asymmetric source and drain extension regions without the need for costly masking steps. In accordance with another embodiment, a source-side halo region is formed before other doped regions are formed to position the halo region closer to the center of the channel region and provide better threshold voltage roll-off control when asymmetric source and drain extension regions are included in the semiconductor component.

Figure 1:
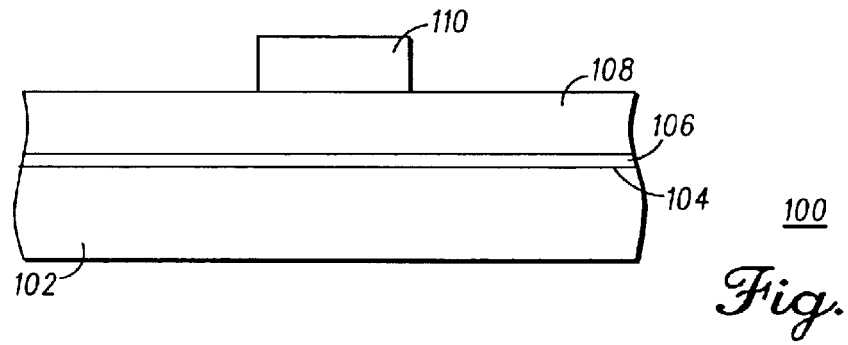
FIGS. 1–6 are highly enlarged cross-sectional views of a portion of an insulated gate field effect transistor in accordance with an embodiment of the present invention.

FIG. 1 is an enlarged cross-sectional view of a portion of a partially completed insulated gate field effect transistor 100 during beginning processing steps in accordance with an embodiment of the present invention. What is shown in FIG. 1 is a semiconductor substrate or material 102 of P-type conductivity having a major surface 104. By way of example, semiconductor substrate 102 is silicon having a <100> crystal orientation and a P-type dopant concentration on the order of $1\times10^{16}$ ions per cubic centimeter (ions/cm$^3$). Alternatively, semiconductor substrate 102 may be comprised of a heavily doped silicon wafer having a <100> crystal orientation and a lightly doped epitaxial layer disposed thereon. Other suitable materials for substrate 102 include silicon germanium, germanium, Silicon-On-Insulator (SOI), and the like. The conductivity type of substrate 102 is not a limitation of the present invention. In accordance with the present embodiment, the conductivity type is chosen to form an N-channel insulated gate field effect transistor. However, the conductivity type of the semiconductor substrate can be selected to form a P-channel insulated gate field effect transistor or a complementary insulated gate field effect transistor, e.g., a Complementary Metal Oxide Semiconductor (CMOS) transistor. In addition, dopant wells such as an N-well in a substrate of P-type conductivity or a P-well in a substrate of N-type conductivity can be formed in substrate 102. The P-channel and N-channel transistors are formed in the respective dopant wells. Although not shown, it should be understood that a threshold voltage adjust implant may be performed in semiconductor substrate 102 or in the dopant wells.

A layer of dielectric material 106 is formed on major surface 104. Dielectric layer 106 serves as a gate dielectric material and may be formed by techniques known to those skilled in the art including thermal oxidation, chemical vapor deposition, and the like. Layer 106 has a thickness ranging from approximately 5 Angstroms (Å) to approximately 500 Å. A layer of polysilicon 108 is formed on dielectric layer 106 using, for example, a chemical vapor deposition technique. A suitable range of thicknesses for polysilicon layer 108 is between approximately 500 Å and approximately 2,000 Å. By way of example, dielectric layer 106 has a thickness of 200 Å and polysilicon layer 108 has a thickness of 1,500 Å. A layer of photoresist is deposited on polysilicon layer 108 and patterned to form an etch mask 110. Techniques for depositing and patterning photoresist are well known to those skilled in the art.

Figure 2:
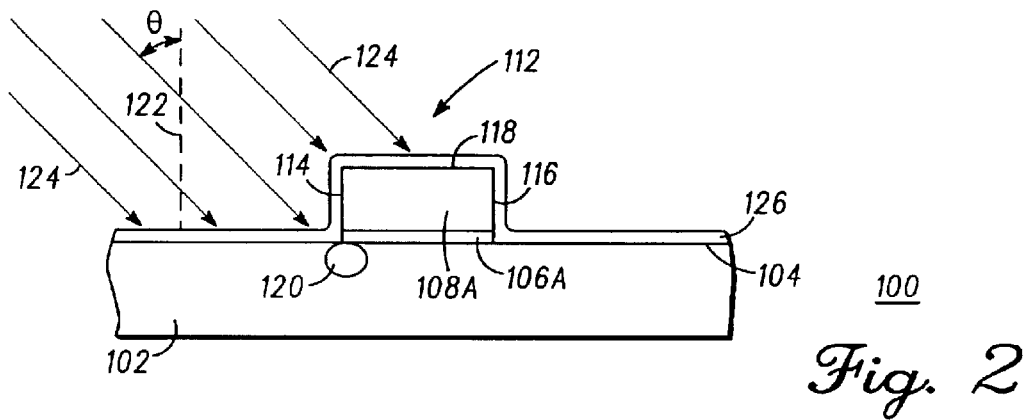

Referring now to FIG. 2, polysilicon layer 108 is etched using an etch chemistry that preferentially etches polysilicon. By way of example, polysilicon layer 108 is etched using anisotropic Reactive Ion Etching (RIE). Methods for etching polysilicon are well known to those skilled in the art. After removal of the exposed portions of polysilicon layer 108, the etch chemistry is changed to anisotropically etch oxide layer 106. The anisotropic etching of oxide layer 106 stops at major surface 104. Then etch mask layer 110 is removed. The remaining portions 108A and 106A of polysilicon layer 108 and dielectric layer 106, respectively, form a gate structure 112 having sides 114 and 116 and a top surface 118. Portion 108A serves as a gate conductor and portion 106A serves as a gate oxide or gate dielectric.

Still referring to FIG. 2, a dopant of P-type conductivity such as, for example, boron or indium, is implanted into semiconductor substrate 102 to form a doped region 120. Doped region 120 is referred to as a source-side halo region. Preferably, the implant is an angled or tilt angle implant which makes an angle θ with respect to a direction (indicated by broken lines 122) substantially perpendicular (or normal) to major surface 104, wherein angle θ is less than 90 degrees and preferably ranges from approximately 20 degrees to approximately 50 degrees. Even more preferably, angle θ ranges between approximately 35 degrees and approximately 45 degrees. A suitable set of parameters for the source-side halo implant includes implanting the dopant of P-type conductivity at a dose ranging between approximately $1 \times 10^{13}$ ions/cm$^2$ and approximately $1 \times 10^{16}$ ions/cm$^2$ and using an implant energy ranging between approximately 100 electron Volts (eV) and approximately 50 kilo electron Volts (keV). The angled dopant implantation is represented by arrows 124. The implant energy and implant dose are exemplary values for forming an N-channel insulated gate field effect transistor and are not limitations of the present invention. As those skilled in the art are aware, the implant energy and implant dose for a P-channel insulated gate field effect transistor may be different. For example, a suitable implant dose for forming a halo region in a P-channel insulated gate field effect transistor may range from approximately 1 keV to approximately 100 keV. The implant can be annealed using a rapid thermal anneal (RTA) process or a conventional furnace anneal process. By way of example, semiconductor device 100 is annealed by heating to a temperature ranging between approximately 800 degrees Celsius (° C.) and approximately 1,100° C. Annealing semiconductor component 100 causes the dopant to diffuse in both the vertical and lateral directions.

Still referring to FIG. 2, a layer of dielectric material 126 is deposited on gate structure 112 and the exposed portions of major surface 104. By way of example, layer of dielectric material 126 is oxide formed by deposition techniques such as, for example, chemical vapor deposition or by growth techniques such as oxidation of gate conductor 108A and silicon 102. Preferably oxide layer 126 has a thickness ranging between approximately 50 Å and approximately 1,500 Å.

Figure 3:
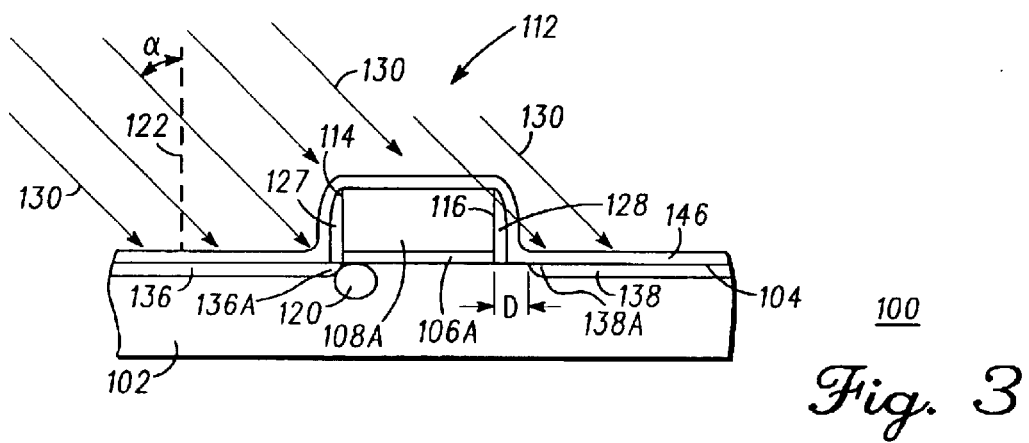

Referring now to FIG. 3, oxide layer 126 is anisotropically etched to form spacers 127 and 128 and to expose major surface 104. A dopant of N-type conductivity such as, for example, arsenic is implanted into semiconductor material 102 to form doped regions 136 and 138. Portions 136A and 138A of doped regions 136 and 138 serve as source and drain extensions, respectively. Preferably, the extension implant is a single twist, angled or tilted implant which makes an angle α with respect to a direction (indicated by broken lines 122) substantially perpendicular (or normal) to major surface 104, wherein angle α is less than 90 degrees and preferably ranges from approximately 0 degrees to approximately 25 degrees. Even more preferably, angle α ranges between approximately 0 degrees and approximately 10 degrees. As those skilled in the art are aware, a single twist implant is one in which the wafers are not rotated about an axis perpendicular to major surface 104 so that a subsequent asymmetric extension implant can be performed. Suitable parameters for the source and drain extension implant include implanting the dopant of N-type conductivity at a dose ranging between approximately $1 \times 10^{14}$ ions/cm$^2$ and approximately $1 \times 10^{16}$ ions/cm$^2$ using an implant energy ranging between approximately 100 eV and approximately 20 keV. The angled dopant implantation is represented by arrows 130. The energy and dose are exemplary values and are not limitations of the present invention. The implant can be annealed using a rapid thermal anneal (RTA) process or a conventional furnace anneal process. By way of example, semiconductor device 100 is annealed by heating to a temperature ranging between approximately 800° C. and approximately 1,100° C. Annealing semiconductor component 100 causes the dopant to diffuse in both the vertical and lateral directions. Thus, the N-type dopant diffuses under gate structure 112 from side 114 and towards and possibly under side 116 of gate structure 112.

Because source and drain extension regions 136A and 138A, respectively, are formed using a single twist, tilt angle implant, they are asymmetric about gate structure 112. Source extension region 136A extends into semiconductor substrate 102 and under gate structure 112 from side 114, whereas drain extension region 138A extends into semiconductor substrate 102 and may extend under gate structure 112 from side 116 or be laterally spaced apart from side 116 of gate structure 112. Thus, the present invention contemplates embodiments where drain extension region 138A extends under gate structure 112 and embodiments where drain extension region 138A does not extend under gate structure 112. For embodiments where drain extension region 138A is spaced apart from side 116, the distance, D, between drain extension region 138A and side 116 is dependent, in part, upon the implantation angle and the height of gate structure 112. In addition, the anneal process affects the distance between drain extension region 138A and side 116. The higher the anneal temperature and the longer the anneal time, the closer drain extension region 138A diffuses towards side 116. Because source extension region 136A is near first side 114, it is said to be proximal or adjacent to first side 114. Likewise, drain extension region 138A is said to be proximal or adjacent second side 116.

Still referring to FIG. 3, a layer of silicon nitride 146 having a thickness ranging between approximately 200 Å and approximately 1,500 Å is formed on gate structure 112, spacers 127 and 128, and the exposed portions of major surface 104. By way of example, silicon nitride layer 146 is deposited using a chemical vapor deposition technique. Alternatively, layer 146 can be an oxide layer or a layer of any material suitable for forming spacers.

Figure 4:
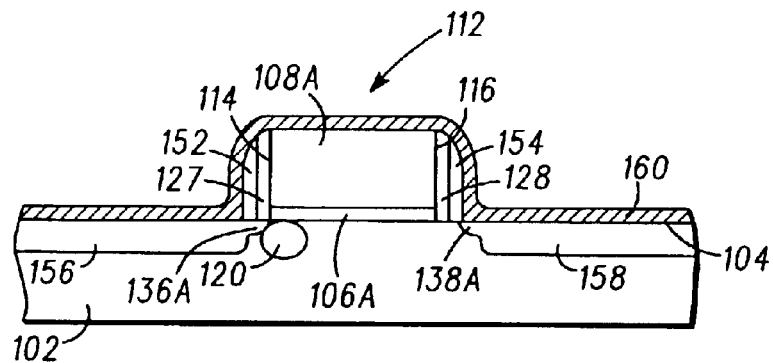

Referring now to FIG. 4, silicon nitride layer 146 is anisotropically etched to form spacers 152 and 154. Thus, spacer 127 is between spacer 152 and side 114 of gate structure 112 and spacer 128 is between spacer 154 and side 116 of gate structure 112. A zero degree source/drain implant is performed to form a source region 156 and a drain region 158. Thus, source region 156 is spaced apart from and aligned to spacer 152 and to side 114 and drain region 158 is spacer apart from and aligned to spacer 154 and to side 116. The source/drain implant also dopes gate structure 112. A suitable set of parameters for the source/drain implant includes implanting a dopant of N-type conductivity such as, for example, phosphorus at a dose ranging between approximately $1 \times 10^{14}$ ions/cm$^2$ and approximately $1 \times 10^{16}$ ions/cm$^2$ and using an implant energy ranging between approximately 5 keV and approximately 100 keV. Semiconductor component 100 is annealed by heating to a temperature between approximately 800° C. and 1,100° C.

Still referring to FIG. 4, an optional wet etch is performed to remove any oxide along top surface 118 of gate conductor 108A and any oxide layer disposed on major surface 104. A layer of refractory metal 160 is deposited on top surface 118, spacers 152 and 154, and the exposed portions of silicon surface 104. By way of example, refractory metal layer 160 is cobalt having a thickness ranging between approximately 50 Å and approximately 300 Å.

Figure 5:
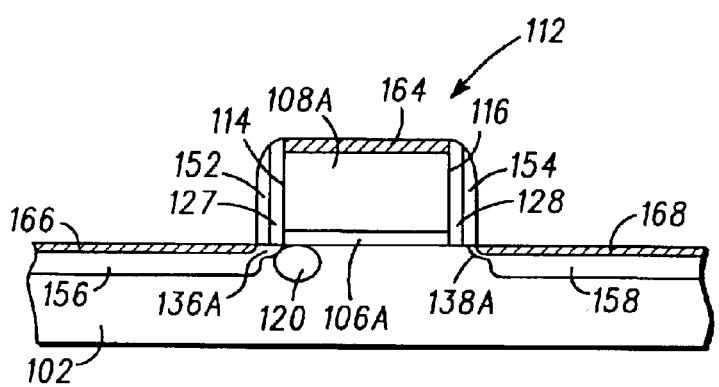

Referring now to FIG. 5 refractory metal layer 160 is heated to a temperature ranging between 600° C. and 700° C. The heat treatment causes the cobalt to react with the silicon to form cobalt silicide (CoSi$_2$) in all regions in which the cobalt is in contact with silicon. Thus, cobalt silicide 164 is formed from gate conductor 108A, cobalt silicide 166 is formed from source region 156, and cobalt silicide 168 is formed from drain region 158. The portions of the cobalt disposed on spacers 152 and 154 remain unreacted. It should be understood that the type of silicide is not a limitation of the present invention. For example, other suitable silicides include titanium silicide (TiSi), platinum silicide (PtSi), nickel silicide (NiSi), and the like. As those skilled in the art are aware, silicon is consumed during the formation of silicide and the amount of silicon consumed is a function of the type of silicide being formed. Thus, silicide 164 is shown as extending into gate conductor 108A, silicide 166 is shown as extending into source region 156, and silicide 168 is shown extending into drain region 158.

Still referring to FIG. 5, the unreacted cobalt is removed using processes known to those skilled in the art. Removing the unreacted cobalt electrically isolates gate conductor 108A, source region 156, and drain region 158 from each other.

Figure 6:
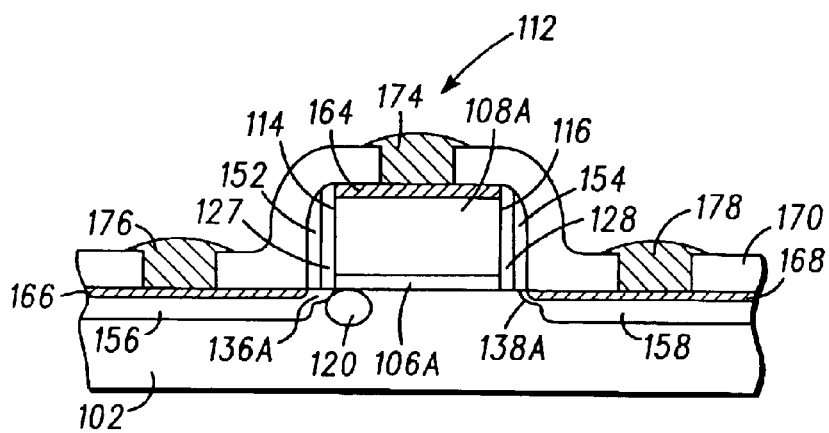

Referring now to FIG. 6, a layer of dielectric material 170 is formed on the structure including the silicided regions. By way of example, dielectric material 170 is oxide having a thickness ranging between approximately 5,000 Å and 15,000 Å. Openings are formed in oxide layer 170 to expose portions of silicide layers 164, 166, and 168. Using techniques well known to those skilled in the art, electrical conductors or electrodes are formed which contact the exposed silicide layers 164, 166, and 168. More particularly, a gate electrode 174 contacts gate silicide 164, a source electrode 176 contacts source silicide layer 166, and a drain electrode 178 contacts drain silicide layer 168.

By now it should be appreciated that an insulated gate semiconductor component and a method for manufacturing the semiconductor component have been provided. In accordance with one aspect of the present invention, the component has asymmetric source and drain extension regions, where the source extension region extends under the gate structure and the drain extension region may extend under the gate structure, be aligned to one edge of the gate structure or be laterally spaced apart from the gate structure. Forming the source extension region under the gate structure (i.e., increasing the overlap of the gate structure with the source-side extension region) lowers the source-side resistance of the semiconductor component and increases the gate-to-source voltage, thereby providing more drive current. This improves the DC performance of the semiconductor component. In addition, reducing or eliminating the overlap of the gate structure with the drain-side extension region reduces the drain-side Miller capacitance which improves the AC performance of the semiconductor component. Further, reducing the amount of overlap between the gate structure and the drain-side extension region reduces the gate-to-drain direct tunneling current. The source-side asymmetric halo region decreases the channel doping near the drain extension region which improves the DC performance of the semiconductor component. The lower channel doping near the drain extension region also lowers the junction capacitance, thereby improving the AC performance of the semiconductor component. This improvement is particularly beneficial when the semiconductor component is an SOI device. Forming the halo region before forming other doped regions provides better threshold voltage roll-off control when using asymmetric extension regions and enables formation of the halo region closer to the center of the channel region, thereby preventing counter doping during the formation of the extension regions.

Although certain preferred embodiments and methods have been disclosed herein, it will be apparent from the foregoing disclosure to those skilled in the art that variations and modifications of such embodiments and methods may be made without departing from the spirit and scope of the invention.

What is claimed is:

1. A method for manufacturing a semiconductor component having an early halo implant, comprising:
    providing a semiconductor material of a first conductivity type having a major surface;
    forming a gate structure on the major surface, the sate structure having first and second sides and a top surface;
    asymmetrically implanting a dopant of the first conductivity type into the semiconductor material using an angled implant that makes an angle less than 90 degrees with respect to a direction normal to the major surface, wherein a portion of the dopant is adjacent the first side of the gate structure and serves as a first halo region;

forming a first spacer adjacent the first side of the gate structure and a second spacer adjacent the second side of the gate structure;

after forming the first halo region, implanting a dopant of the second conductivity type into the semiconductor material using an angled implant that makes an angle less than 90 degrees with respect to a direction normal to the major surface, wherein a portion of the dopant is adjacent the first side of the gate structure and serves as a first extension region, and wherein another portion of the dopant is adjacent to the second side of the gate structure, serves as a second extension region, and is laterally spaced apart from the second side of the gate structure; and forming first and second doped regions of a second conductivity type in the semiconductor material after forming the first halo region, the first doped region proximal the first side of the gate structure and the second doped region proximal the second side of the gate structure.

2. The method of claim 1, wherein asymmetrically implanting the dopant into the semiconductor material includes implanting at an angle ranging between 20 degrees and 50 degrees.

3. The method of claim 1, wherein asymmetrically implanting the dopant into the semiconductor material includes implanting at an angle ranging between 35 degrees and 45 degrees.

4. The method of claim 1, further including forming third and fourth spacers adjacent the first and second spacers, respectively.

5. The method of claim 4, wherein forming the first and second doped regions includes aligning the first doped region to the third spacer and the second doped region to the fourth spacer.

6. The method of claim 1, wherein forming the first extension region includes implanting a dopant of the second conductivity type into the semiconductor material using an angled implant at an angle ranging from 0 degrees to 20 degrees.

7. A method for manufacturing a semiconductor component, comprising:

providing a semiconductor material of a first conductivity type having a major surface;

forming a gate structure on the major surface, the gate structure having first and second sides and a top surface;

forming a halo region of the first conductivity type proximal the first side of the gate structure;

forming a first spacer adjacent the first side of the gate structure and a second spacer adjacent the second side of the gate structure;

implanting a dopant of a second conductivity type into the semiconductor material using an angled implant, wherein the angled implant makes an angle between 0 degrees and 90 degrees with respect to a direction normal to the major surface, and wherein a portion of the dopant is adjacent the first side of the gate structure and extends under the gate structure and serves as a first extension region and another portion of the dopant of the second conductivity type is adjacent the second side of the gate structure and serves as a second extension region, wherein the second extension region is laterally spaced apart from the second side of the gate structure;

forming third and fourth spacers adjacent the first and second spacers, respectively;

forming a source region of the second conductivity type in the semiconductor material, the source region spaced apart from the first side by the first and third spacers; and forming a drain region of the second conductivity type in the semiconductor material, the drain region spaced apart from the second side by the second and fourth spacers.

8. The method of claim 7, wherein forming the halo region comprises implanting a dopant of the first conductivity type into the semiconductor material using an angled implant, wherein the angled implant makes an angle between 20 degrees and 50 degrees with respect to a direction normal to the major surface.

9. The method of claim 8, wherein the angled implant for forming the halo region makes an angle between 35 degrees and 45 degrees with respect to a direction normal to the major surface.

10. The method of claim 8, wherein implanting the dopant of the second conductivity type into the semiconductor material includes using an angled implant that makes an angle between 0 degrees and 25 degrees with respect to a direction normal to the major surface.

\* \* \* \* \*

UNITED STATES PATENT AND TRADEMARK OFFICE
CERTIFICATE OF CORRECTION

PATENT NO. : 6,833,307 B1
DATED : December 21, 2004
INVENTOR(S) : Wrister, Derick et al.

It is certified that error appears in the above-identified patent and that said Letters Patent is hereby corrected as shown below:

Column 6,
Line 59, replace "sate" with -- gate --.

Signed and Sealed this

Twenty-sixth Day of July, 2005

JON W. DUDAS
*Director of the United States Patent and Trademark Office*